United States Patent [19]

Dolan et al.

[11] Patent Number: 5,798,611
[45] Date of Patent: Aug. 25, 1998

[54] LAMP HAVING CONTROLLABLE SPECTRUM

[75] Inventors: James T. Dolan, Frederick; Michael G. Ury, Bethesda; Charles H. Wood, Rockville; Brian Turner, Myersville, all of Md.

[73] Assignee: Fusion Lighting, Inc., Rockville, Md.

[21] Appl. No.: 149,818

[22] Filed: Nov. 10, 1993

Related U.S. Application Data

[63] Continuation of Ser. No. 60,553, May 13, 1993, abandoned, which is a continuation-in-part of Ser. No. 867,551, Apr. 13, 1992, abandoned, Ser. No. 875,769, Apr. 29, 1992, abandoned, Ser. No. 882,409, May 13, 1992, abandoned, and Ser. No. 779,718, Oct. 23, 1991, abandoned, which is a continuation-in-part of Ser. No. 604,487, Oct. 25, 1990.

[51] Int. Cl.$^6$ ........................................... H01J 61/18
[52] U.S. Cl. ........................... 313/570; 313/231.61
[58] Field of Search ........................... 313/570, 231.61

[56] References Cited

U.S. PATENT DOCUMENTS

| | | | |
|---|---|---|---|
| 3,234,421 | 2/1966 | Reiling | 313/25 |
| 3,748,520 | 7/1973 | Silver | 313/571 |
| 3,764,843 | 10/1973 | Van Eijl et al. | 313/639 |
| 3,824,423 | 7/1974 | Pappalardo et al. | 313/11 |
| 3,873,884 | 3/1975 | Gabriel | 315/267 |
| 3,984,727 | 10/1976 | Young | 315/267 |
| 4,039,880 | 8/1977 | Beijer et al. | 315/56 |
| 4,178,563 | 12/1979 | Huet et al. | 372/84 |
| 4,427,922 | 1/1984 | Proud et al. | 315/248 |
| 4,476,413 | 10/1984 | Gough et al. | 313/550 |
| 4,495,440 | 1/1985 | Schlitt et al. | 313/492 |
| 4,532,427 | 7/1985 | Matthews et al. | 250/492.2 |
| 4,683,525 | 7/1987 | Camm | 362/346 |
| 4,810,938 | 3/1989 | Johnson et al. | 315/248 |
| 4,859,906 | 8/1989 | Ury et al. | 313/639 |
| 4,937,503 | 6/1990 | Sigai et al. | 315/248 |
| 4,945,290 | 7/1990 | Eliasson et al. | 315/246 |
| 4,978,891 | 12/1990 | Ury | 315/117 |
| 5,069,546 | 12/1991 | Liang et al. | 356/316 |
| 5,151,633 | 9/1992 | Farral et al. | 315/248 |
| 5,404,076 | 4/1995 | Dolan et al. | 313/572 |

FOREIGN PATENT DOCUMENTS

| | | | |
|---|---|---|---|
| 52-31583 | 3/1977 | Japan | H01J 61/20 |
| A-55 10755 | 1/1980 | Japan | H01J 61/16 |
| 55-95265 | 7/1980 | Japan | H01J 61/38 |
| 1282239 | 7/1987 | U.S.S.R. | H01P 65/05 |
| WO92/08240 | 5/1992 | WIPO | H01J 61/18 |
| WO93/21655 | 10/1993 | WIPO | H01J 61/38 |

OTHER PUBLICATIONS

Astle/Weast "CRC Handbook of Chemistry and Physics 59th Ed." 1978 pp. E-309, E-315-E-316.

"Radiative Efficiencies of Radio Frequency Sulfur Discharges", by K.J.N. Badura and J.T. Verdeyen, *IEEE Journal of Quantum Electronics*, vol. QE-21, No. 7, Jul. 1985, pp. 748-750.

"Stable Pure Sulfur Discharges and Associated Spectra", by D.A. Peterson and L.A. Schlie, *J. Chem. Phys.* 73(4), 15 Aug. 1980, pp. 1551-1566.

(List continued on next page.)

Primary Examiner—Alvin E. Oberly
Assistant Examiner—Lawrence O. Richardson
Attorney, Agent, or Firm—Pollock, Vande Sande & Priddy

[57] ABSTRACT

The spectral energy characteristic of a discharge lamp is controlled by changing the density of the fill substance. The spectral characteristic can be shifted while substantially maintaining its shape by changing the density of the fill. A sulfur or selenium containing discharge lamp which is operated at a pressure of at least about 1 atmosphere contains a low ionization potential substance in the fill. Characteristics which are improved are one or more of spatial color uniformity, extinguishing characteristics, and bulb starting reliability. Particular substances which are added to the fill are alkalai metal containing substances, III B metal containing substances, and alkaline earth metal containing substances. When light is reflected back into the bulb, the light which is re-emitted is stronger in the higher wavelengths.

7 Claims, 12 Drawing Sheets

OTHER PUBLICATIONS

"Technique For Measuring Rotational Temperature of Microwave Excited Diatomic Sulfur", by V.E. Merchant and M.L. Andrews, *Applied Optics*, 15 Sep. 1980, vol. 19, No. 18, pp. 3113–3117.

"Detection of Sulfur Dimers in $SF_6$ and $SF_6/O_2$ Plasma–Etching Discharges", by K.E. Greenberg and P.J. Hargis, Jr., *Appl. Phys. Lett.* 54(14), 3 Apr. 1989, pp. 1374–1376.

*The Identification of Molecular Spectra*, by R.W.B. Pearse and A.G. Gaydon, John Wiley & Sons, Inc., New York, 1976, pp. 293–297.

Patent Abstracts of Japan, vol. 4, No. 40 (E–004), Mar. 28, 1980 relating to JP–A–55 010 755 (Ushio Inc), Jan. 25, 1980.

Patent Abstracts of Japan, Abstract of Publication No. JP 62272448, Nov. 26, 1987.

Childs et al., "Some Characteristics of Low Pressure, Sulfur, Microwave–Excited Electrodeless Discharge Lamps", Applied Spectroscopy, vol. 30, No. 5, pp. 507–509, Baltimore US.

Bentley et al., "Preparation of Electrodeless Discharge Lamps For Elements Forming Gaseous Covalent Hydrides", Analytical Chemistry, vol. 49, No. 4, Apr. 1977, pp. 551–554, Columbus US.

John Waymouth, "Electric Discharge Lamps", The M.I.T. Press, pp. 151, 196–199.

Sabaro Ito & Shingo Esaki, "Characteristics of $AlI_3$ Metal Halide Lamp" (Japanese article with English Abstract), Published after 1967 (Date of last reference cited).

Designers Handbook, Light Source Applications, J.F. Waymouth, R.E. Lenn, Editors, 1980, p. 56.

D.A. MacLennan, J.T. Dolan, M.G. Ury, "New Long–Lived Stable Light Source for Projection–Display Applications", Society for Information Display International Symposium, Digest of Technical Papers, vol. XXIII, pp. 460–463, May 20, 1992.

James T. Dolan, Michael G. Ury and Charles H. Wood, "A Novel High Efficacy Microwave Powered Light Source", Presented as a Landmark Paper, Sep. 2, 1992, Sixth International Symposium on the Science and Technology of Light Sources, Technical University of Budapest.

Abstract of "A Novel High Efficacy Microwave Powered Light Source", from Invited Papers and Abstracts, The 6th International Symposium On The Science & Technology of Light Sources, Budapest–Hungary, 30 Aug.–3 Sep. 1992.

D.A. MacLenna, J.T. B.P. Turner, "Small Long–Lived Stable Light Source for Projection–Display Applications", Society for Information Display, International Symposium, Digest of Technical Papers, vol. XXIV, pp. 716–719, May 19, 1993.

LAMP HAVING CONTROLLABLE SPECTRUM

The present application is a continuation of U.S. application Ser. No. 060,553 filed May 13, 1993, abandoned which in turn is a continuation-in-part of U.S. application Ser. No. 867,551, filed Apr. 13, 1992, abandoned U.S. application Ser. No. 875,769 filed Apr. 29, 1992, abandoned and U.S. application Ser. No. 882,409, filed May 13, 1992, abandoned each of which application is a continuation-in-part of U.S. application Ser. No. 07/779,718, filed Oct. 23, 1991, abandoned which is a continuation-in-part of U.S. application Ser. No. 07/604,487, filed Oct. 25, 1990.

One aspect of the present invention relates to an improved visible lamp, and particularly to such a lamp which has a controllable spectral output.

As is well known, the color of the light which is provided by a lamp is determined by the spectral energy distribution of the emitted radiation. In general, visible light sources emit over the spectral range of 350–750 nanometers.

It is desirable to be able to control the "tint" of a lamp which nominally emits over the entire visible spectrum. For example, for certain applications it may be desirable for the light to be tinted red, while for certain other applications, a green tint may be preferred. In addition to being able to provide different lamps having different tints, it is also desirable to be able to vary the tint or spectral emphasis of the light which is emitted by a particular lamp during operation.

In the prior art, discharge lamps are typically provided with different spectral emphases by employing fill additives. For example, a metal halide lamp which is doped with thallium emphasizes the green part of the spectrum, whereas one which is doped with sodium would emphasize the yellow. One disadvantage of such lamps is that a different additive or combination of additives must be used to make each differently tinted lamp, thus introducing manufacturing complexities. Additionally, due to the fact that different fill substances have different aging characteristics, the spectra of lamps using additives are prone to change over time.

Another approach to modifying the color output of a lamp is to use external filters. However, such devices inevitably reduce the efficacy of the overall lamp system. It is also known that incandescent lamps can be made more red by reducing the operating temperature of the filament, but this also has the effect of reducing the lamp efficacy.

Additionally, the above schemes which are known to the prior art change the color emphasis of the light output by changing the shape of the overall spectral distribution, i.e., by emphasizing one portion of the spectrum but not others. However, it has been found that for certain applications, it is advantageous to change the color emphasis while retaining substantially the same shape for the overall spectral distribution. For example, in red/green/blue (RGB) color reproduction systems such as a liquid crystal display (LCD) high definition television, it is desirable to provide a lamp having a spectral energy distribution which can emphasize the blue or red without substantially distorting the shape of the overall distribution.

In U.S. application Ser. Nos. 779,718, filed Oct. 23, 1991, 604,487, filed Oct. 25, 1990, 882,410, filed May 13, 1992 and 08/071,027, filed Jun. 3, 1993, now U.S. Pat. No. 5,404,076 all of which are incorporated herein by reference, a new type of discharge lamp is disclosed which uses a fill which contains a sulfur or selenium containing substance. The fill is present at a pressure of at least about 1 atmosphere, and is excited at a relatively high power density. The lamp produces a molecular spectrum in the visible part of the spectrum at a relatively high efficacy and has exhibited a long lifetime and a stable color output over time.

While the lamp disclosed in the prior applications has many advantageous properties, when not used in accordance with an aspect of the present invention, the spectral output or color temperature may vary around the periphery of the bulb. It is of course desirable for many applications, for the spectral output to be uniform around the bulb surface, so that all portions of the illuminating energy appear to be the same color.

It has also been found that the above-described spatial "color separation" effect may become more pronounced when the discharge lamp is operated at low power levels. Furthermore, at such power levels the bulb may extinguish or the discharge may retreat from the bulb walls.

In accordance with a first aspect of the present invention, a discharge lamp is provided which has a fill substance which emits primarily throughout the visible part of the spectrum, and which has the property of having a visible spectral distribution which can be changed by controlling the density of the fill substance.

In accordance with a second aspect of the invention, a discharge lamp is provided which has a fill substance which emits primarily throughout the visible part of the spectrum, and which has the property of having a visible spectral characteristic which can be shifted in wavelength without substantially changing the shape of the characteristic by controlling the density of the fill substance.

In accordance with a third aspect of the present invention, discharge lamps which have a sulfur or selenium based fill are provided with different spectral emphases or tints by controlling the fill density of a sulfur or selenium containing fill substance.

In accordance with a fourth aspect of the invention, discharge lamps having visible spectral characteristics of substantially the same shape, but shifted in wavelength from each other, are provided by controlling the fill density of a sulfur or selenium containing fill substance.

In accordance with a fifth aspect of the invention, the spectral output of a discharge lamp having a sulfur or selenium containing fill is controlled in real time by controlling the fill density during operation. This may be accomplished by controlling the cooling which is applied to the lamp bulb to condense more or less of the fill substance out of the gaseous fill.

Additionally, in accordance with an aspect of the present invention, the bulb fill is constituted so as to obviate the above-described effects of spatially varying spectral output or color temperature. Thus, the lamp may be configured so that it emits with a uniform color temperature around the bulb surface. Additionally, operation at lower power levels without extinguishing may be possible.

In accordance with a sixth aspect of the present invention, a substance is added to the bulb fill which improves the spatial uniformity of the color temperature of the light which is emitted by the bulb.

In accordance with a seventh aspect of the invention, a substance is added to the fill which improves the starting of the lamp.

In accordance with a eighth aspect of the invention, a substance is added to the fill which allows the lamp to be effectively operated at lower power levels.

In accordance with a ninth aspect of the invention, a substance is added to the fill which has a low ionization potential.

In accordance with a tenth aspect of the invention, a substance is added to the fill which is an alkalai metal containing substance.

In accordance with a eleventh aspect on the invention, a substance is added to the fill which is a III B metal containing substance.

In accordance with a twelfth aspect of the invention, a substance is added to the fill which is an alkaline earth metal or a rare earth element containing substance.

In accordance with a thirteenth aspect of the invention, mercury is added to the fill.

In accordance with a fourteenth aspect of the invention, an improved bulb is provided, which may be used in a discharge lamp.

It is known in the prior art to add the substance sodium, which is an alkalai metal, to discharge lamps to provide spectral emphasis, and to arc lamps in particular to rectify a problem known as "arc constriction" wherein the discharge between the electrodes becomes undesirably constricted in certain regions.

It has been discovered in accordance with the present invention that when a low ionization potential material is added to the fill of a high pressure lamp containing sulfur or selenium, the spatial uniformity of the color temperature of the light emitted by the bulb and/or the starting characteristics of the lamp are improved.

It has further been discovered that when an alkalai metal containing substance is added to the fill of a high pressure lamp wherein the primary light emitting fill component is a sulfur or selenium containing substance, the following advantages are provided:

a) the color temperature of the emitted light around the surface of the bulb becomes spatially more uniform, and this is in general true even at lower power densities;

b) the lamp starts more reliably; and c) the lamp may be operated at lower power levels without extinguishing.

Additionally, it has been discovered that when a III B metal containing substance is added to the lamp fill of a high pressure sulfur or selenium containing lamp, the spatial uniformity of the color temperature of the emitted light around the bulb is improved.

In accordance with a still further aspect of the present invention, it has been found that when the light which is emitted by a sulfur or selenium based discharge lamp is reflected back into the bulb, the resultant light which is re-emitted is stronger in the higher wavelengths, i.e., the red portion of the spectrum. Therefore, by using a reflector which is approximately spherical in shape, a lamp which is richer in red wavelengths may be provided. Additionally, by using a wavelength selective reflector, such as a dichroic reflector, a lamp having a spectral output which is more nearly equivalent to that of a black body may be provided. Also, by the use of such wavelength selective reflectors, lamps which are well suited to particular applications may be provided.

The invention will be better understood by referring to the accompanying drawings wherein:

DETAILED DESCRIPTION OF THE INVENTION

Figure 1:
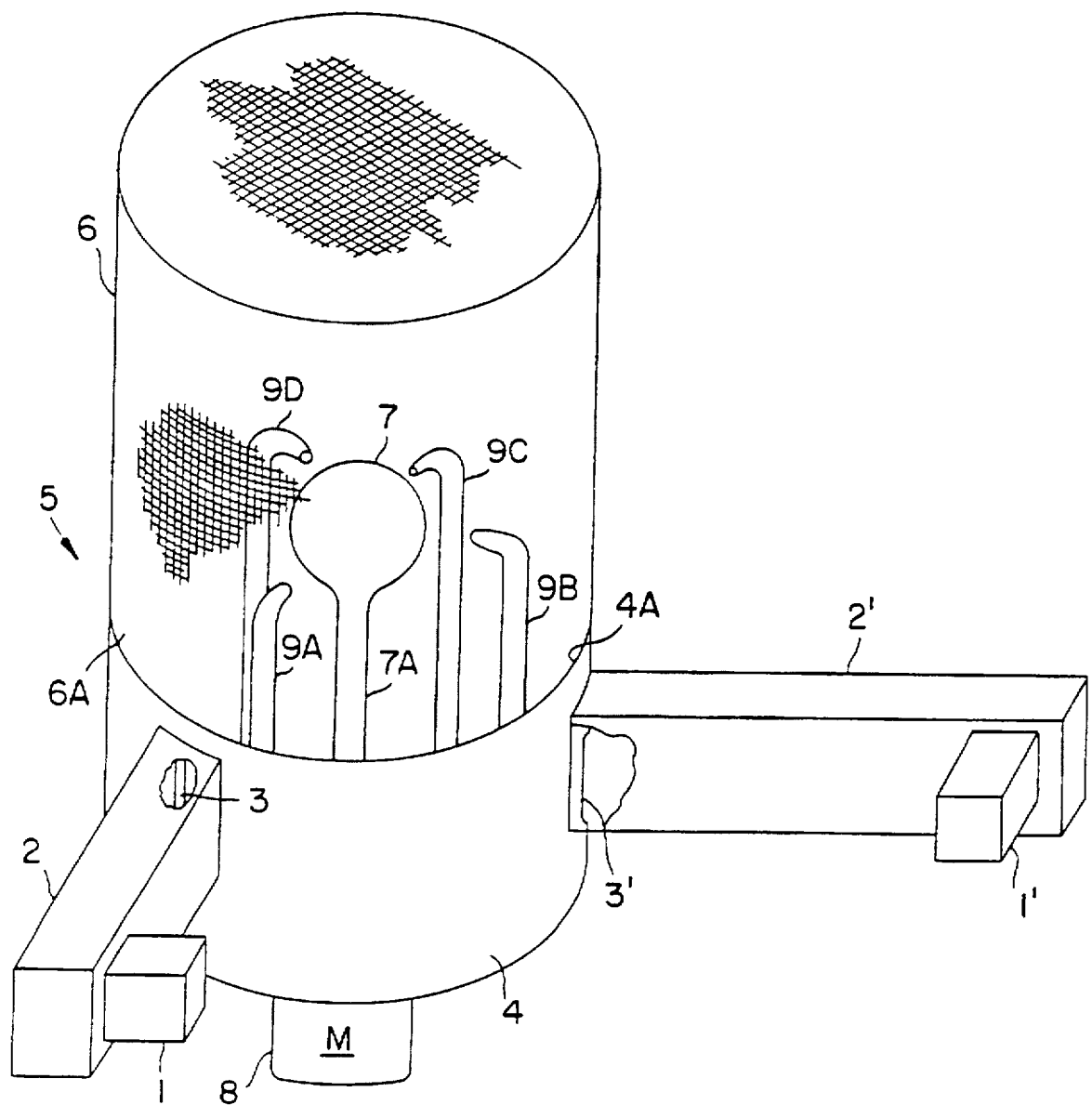
FIG. 1 shows a microwave powered electrodeless lamp.

FIG. 1 shows a microwave powered electrodeless lamp into which the present invention may be incorporated. Referring to the figure, a pair of magnetrons 1, 1' generate microwave energy which propagates along waveguides 2, 2'. The waveguides lead to microwave cavity 5 which is comprised of solid conductive wall, cup-shaped part 4, and metal mesh cup-shaped part 6, which are joined at their respective ends 4A, 6A. Within the end of the waveguides 2,2', on the solid wall are located antenna slots 3,3' which serve to couple microwave energy from the waveguide into the cavity where it causes an oscillating field to occur.

A discharge bulb 7 including a supporting stem 7A is located within cavity 5. The supporting stem is connected through a hole (not shown) in solid cup shaped part 4, to the shaft of a motor 8. The motor rotates the bulb 7 to improve the cooling of the bulb.

As mentioned above, the fill in bulb includes a sulfur or selenium containing substance. It is further desirable to use an inert gas, such as argon or xenon, which aids in starting the discharge. The lamp of FIG. 1 may be characterized as a high pressure lamp. Thus, the fill in bulb 7 is present in amounts such that the fill pressure is at least 1 atmosphere or above when excited to operating temperature, and is preferably 2 to 20 atmospheres. Furthermore, the fill pressure is mainly controlled by the primary radiating component, which typically has a substantially higher partial pressure than that of other constituents when the lamp is operational. The illumination provided by the lamp may be augmented in various regions of the spectrum by including certain additives in the fill.

As noted above, in addition to using sulfur and selenium in elemental form, compounds of these elements may be used. For example, $InS$, $As_2S_3$, $CS_2$, $SeO_2$, $SeCl_4$, and $HgSe$, as well as other compounds of sulfur and selenium, may be used. The compounds which are used have a low vapor pressure at room temperature, i.e., they are in a solid or liquid state, and a high vapor pressure at operating temperature.

The term "a sulfur containing substance" as used herein, includes both elemental sulfur and sulfur compounds, while the same is true for the corresponding terms as applied to selenium. It should be appreciated that the primary radiating component of the fill may be comprised of a combination of a sulfur containing substance and a selenium containing substance, rather than only one of these substances. Additionally, the primary radiating component may be comprised of a mixture of the elemental form and a compound(s) of a particular substance or substances.

The fill is excited at power densities in excess of 50 watts/cc and preferably in excess of 100 watts/cc. As stated in application Ser. Nos. 779,718 and 882,410 in the computation of power density, the volume, refers to the volume of the light emitting gas rather than to the volume of the bulb.

Figure 2:
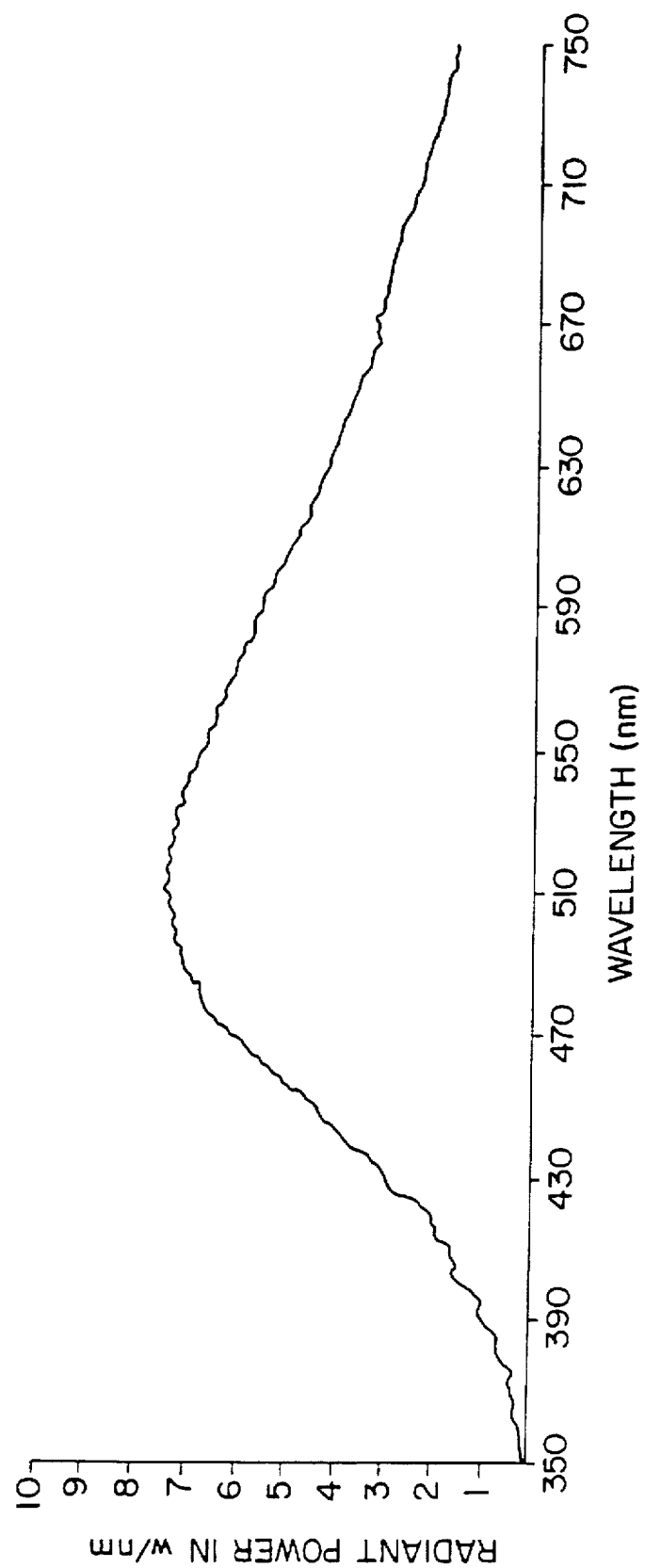
FIG. 2 shows a spectral energy distribution with a peak at 515 nanometers.

Referring to FIG. 2, the spectral energy distribution of a lamp as shown in FIG. 1 is shown. The spectral power distribution shown in FIG. 2, covers the range from 350 to 750 nanometers, which is generally the visible range. The spectrum has its peak at about 515 nanometers, and the output appears to be white with a green tint. As is seen, the spectrum is continuous throughout the visible range. Analyses of the spectral energy distribution according to the 1931 CIE (Commission International de l'Eclairage) determines a correlated color temperature of 6000 degrees kelvin and x and y coordinates of 0.320 and 0.386 respectively on the chromaticity diagram. The bulb which provided the spectrum which is shown in FIG. 2 was provided with a discharge fill consisting of 2.5 milligrams per cubic centimeter of sulfur, and 60 torr of argon.

Figure 3:
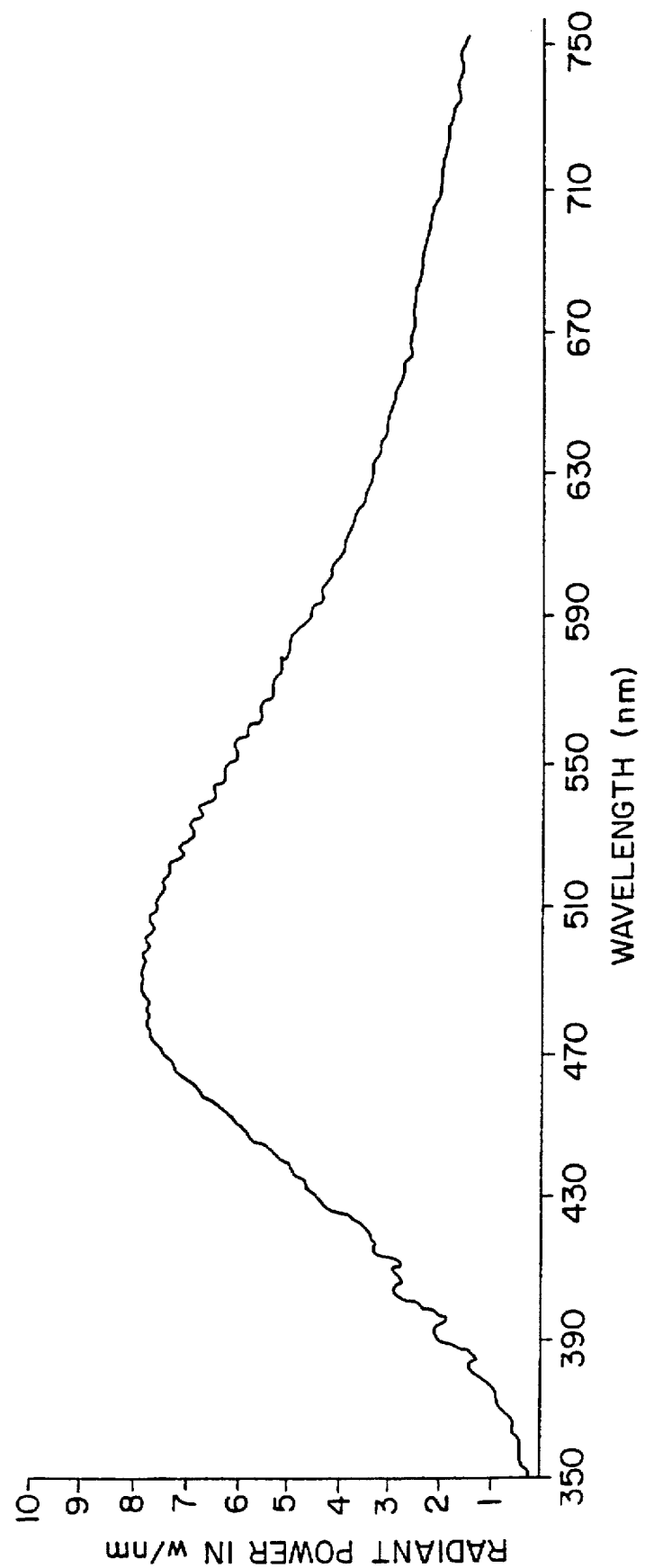
FIG. 3 shows a spectral power distribution with a peak at 490 nanometers.

Referring to FIG. 3, the spectral power distribution of a second lamp made and operated according to the invention is shown. This lamp was operated under the same conditions as the lamp represented in FIG. 2, but the lamp represented in FIG. 3 was provided with sulfur of somewhat lesser density than the lamp represented in FIG. 2, that is 1.3 milligrams per cubic centimeter. This bulb also had 60 torr of argon. The output appears white but in this case with a blue tint, and the peak of the spectral energy distribution occurs at about 490 nanometers. The correlated color temperature is 8500 degrees kelvin, while the x and y coordinates on the chromaticity diagram are 0.275 and 0.334 respectively.

It should be noted that both of the spectra shown in FIGS. 2 and 3 ascend from near zero smoothly from the 350 nanometer mark to their respective peaks, and descend more gradually to a low level at the 750 nanometer mark. Aside from the slight jitter, the curves are smooth. This is in contrast to the ubiquitous variants of metal halide lamps which exhibit strong line spectra. Additionally, it is significant to note that the shape of the spectrum is substantially preserved between the first and the second spectra. However, due to the spectral shift, it will be seen that the amplitude of the spectrum shown in FIG. 2, which peaks at 490 nanometers is higher at the lower wavelengths and lower at the higher wavelengths than that shown in FIG. 3, which peaks at 515 nanometers.

Figure 4:
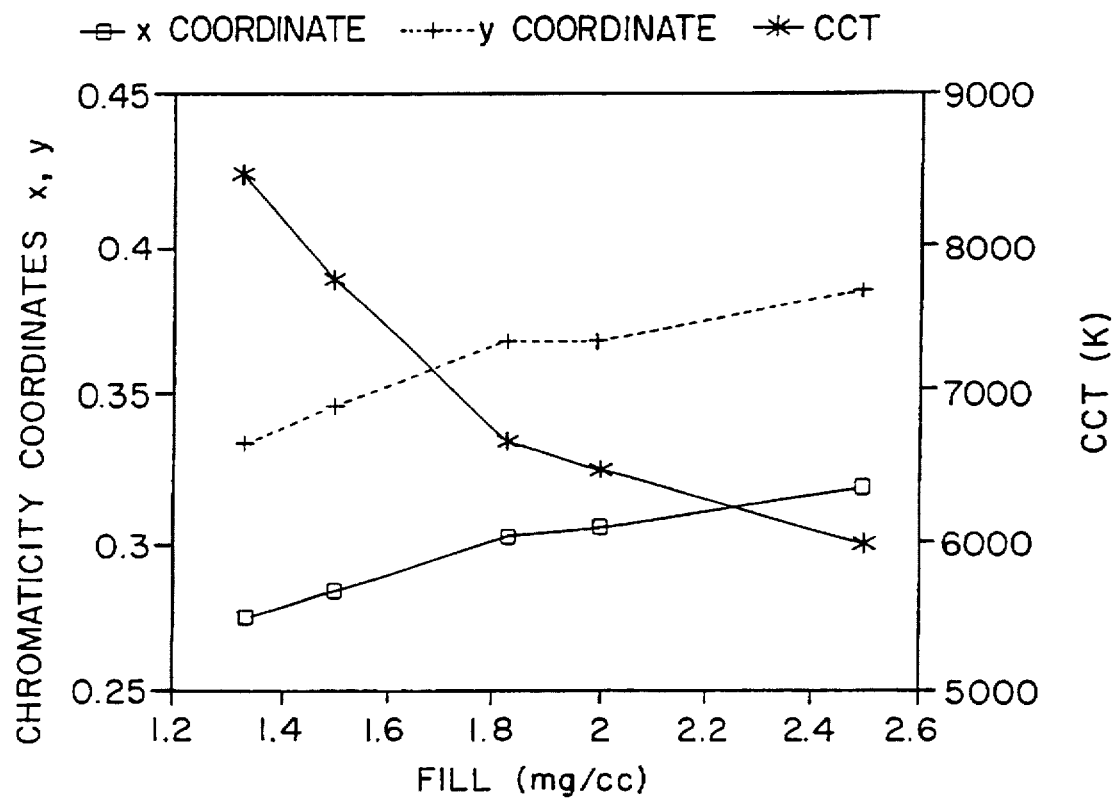
FIG. 4 shows a graph of wavelength peak vs. fill density.

Although the spectral energy distributions which are shown in FIGS. 2 and 3 are significantly shifted from each other, they by no means represent the extremes in what is available in the practice of the invention. That is, lesser or greater amounts of fill can be used to achieve shifts in the spectrum toward shorter or longer wavelengths respectively. This is illustrated in FIG. 4, which is a graph of peak wavelength vs. sulfur density for the lamp which is shown in FIG. 1.

With regard to the choice between a sulfur containing substance, a selenium containing substance or combinations thereof, the following is to be noted. For a given fill density sulfur will provide a higher color temperature and selenium a lower color temperature. Furthermore, a fill in which a combination of sulfur and selenium is used has the advantage that higher total vapor pressures can be obtained from the two somewhat independent partial pressures, and a further shift to the red can be obtained. Additionally, it has been determined that a fill comprising a mixture of sulfur and selenium provides a spectrum having a shape as shown in FIGS. 2 or 3. It is contemplated that the relative shift of the spectrum attained with a bulb using both materials in the fill can be controlled between the extremes of fills containing the only one of the materials by selecting the ratio of sulfur and selenium in the fill. Increasing the sulfur density and decreasing the selenium density will raise the color temperature, and vice versa.

As mentioned above, such lamps may have particular applicability to a red/green/blue (RGB) color display system. The region of the chromaticity diagram extending from about 0.200 to about 0.490 on the x axis, and about 0.200 to about 0.450 on the y axis is white light, while various subregions will have a discernable tint. A source which falls within the white region is suitable for use in an RGB color system in which the light from the source is separated into the three primary color beams which are modulated imagewise and recombined to form a color image. It is however, desirable to be able to shift the spectrum while preserving its shape in order to provide an optimum spectrum for a particular RGB system.

As mentioned above, various regions of the spectrum may be augmented by including certain additives in the fill. For example, one such fill, which is described in above-mentioned U.S. application Ser. No. 07/604,487 in a bulb of 2.84 cm internal diameter utilizes 0.053 mg. moles/cc of sulfur, 0.008 mg. moles/cc of cadmium, and 0.003 mg. moles of cadmium iodide.

The lamp of the present invention has particular utility as a projection source, for example, for use in high definition television.

According to another embodiment of the invention, the spectral energy distribution of a particular lamp can be controlled during lamp operation. In this embodiment the effective fill density is changed by increasing the cooling of the bulb, such as by increasing the pressure of the cooling air which is delivered to cooling jets 9A, 9B, 9C, 9D in FIG. 1 to the point that some of the fill in the bulb condenses on the inside of the envelope and ceases to participate in the discharge. A bulb may be modified to provide a special area or a side pipe may be provided in which the fill material will be selectively caused to condense. In this way the condensed fill will not interfere with the light emission from the bulb. The special area may simply be a certain area of an unmodified standard shaped bulb which is provided with augmented cooling. For example in the lamp shown in figure one the cooling jet 9A which cools the lowest part of the bulb, whereat the stem is connected, may be operated at higher air pressure. In this way, fill condensation will occur at that area of the bulb which is out of the way of the emission directed at towards the lamps optics. Although not shown the optics may comprise a reflector with its optical axis coincident with the cylindrical axis of the cavity.

Figure 5:
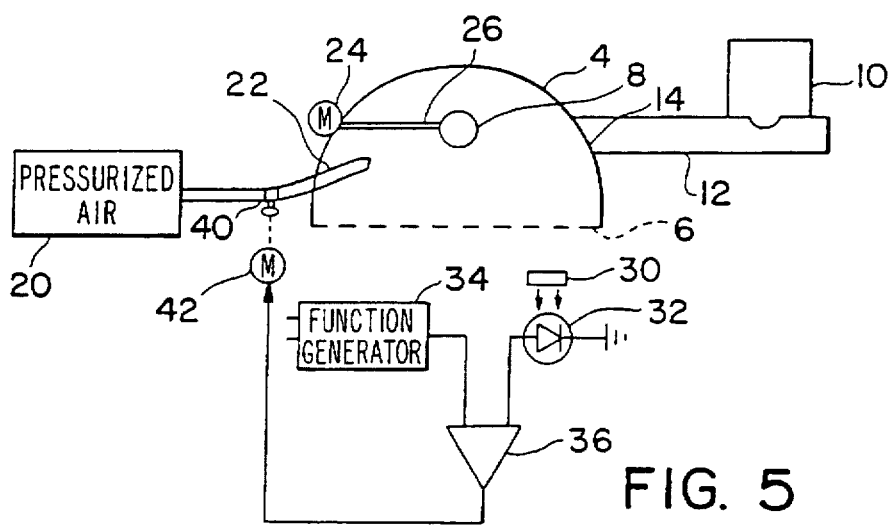
FIG. 5 shows a system wherein the fill density is controlled by varying the cooling of the lamp.

A system for controlling bulb temperature is shown in FIG. 5, which appears in U.S. Pat. No. 4,978,891, which is incorporated herein by reference.

Referring to FIG. 5, filter 30 is provided and is located so as to receive light from the lamp. Filter 30, for example, may be a band pass filter which transmits light only in the blue region of the spectrum, and is followed by photodetector 32 which generates a comparison signal.

Function generator 34 is also provided, which is capable of generating a preselected function signal of desired, arbitrary shape. The outputs of photodetector 32 and function generator 34 are fed to comparator 36, which generates a difference signal. This difference signal is fed back to the cooling fluid supply system to control the amount of cooling fluid impinging on the bulb.

For example, in FIG. 5, an exemplary control for the cooling fluid supply is a needle valve 40, the position of which is controlled by stepping motor 42. Alternatively, the input to pressurized air supply 20 could be throttled or the supply could be vented, to control cooling.

Thus in accordance with this embodiment, whenever the output in the blue region is different than that which has been programmed by function generator 34, a difference signal results, which causes the cooling of the lamp bulb 8 to vary, until the difference signal is at or approaches zero.

Another method of changing the shifting spectrum would be to vary the power while maintaining constant cooling. This would result in partial condensation of the fill and would change the effective fill density in the bulb resulting in a shift of the spectral energy distribution.

A combination of sulfur and selenium containing fill substances can be advantageously used in the embodiments in which the spectrum is shifted during operation. Sulfur has a higher vapor pressure as well as a somewhat higher color temperature. As a discharge bulb containing both sulfur and selenium is cooled to the point that a portion of the fill condenses on the bulb 7 wall, the overall operational fill density will be lowered leading to a higher color shift (i.e by way of a shift of the spectrum to the blue). A second compounding effect is that the selenium will condense out faster leaving an effective operating fill which has more sulfur, which by its nature gives a higher color temperature.

It should be noted that as used herein, the term "primary radiating component" means that fill component which provides a radiation output which is at least as great as any other fill component.

It should be understood that the above embodiments have been illustrated in connection with specific lamps, but that other specific lamp structures may be used as well. For example, the shape of the microwave cavity as well as the microwave coupling schemes may be varied, and the invention is also applicable lamps which are powered with radio frequency (r.f.) energy, as well as to arc lamps.

While one advantage of the invention is that it provides a lamp which is capable of operating without using mercury, the addition of a small amount of mercury may help lamp starting. Additionally, for those applications where the presence of mercury is not considered to be a problem, it has been found that the addition of more substantial amounts of mercury increases efficiency significantly.

For example, in a bulb of 5 mm ID (6 mm OD), having a volume of $6.5 \times 10^{-2}$ cc, a mercury dose of about 5 mg was added to a sulfur dose of about 0.33 mg, and 150 torr of argon. The pressure of the mercury vapor at operating temperature was about 90 atmospheres.

At 570 watts microwave input power input, the addition of the mercury resulted in an 11% improvement in efficacy, and had a significantly lower cooling requirement, which allows a less noisy pressurized cooling air source to be used. Such a lamp would be suitable for uses as a projection lamp.

In accordance with a further embodiment, xenon is used as the inert gas, and is present at partial pressure during operation which is less than but comparable to the sulfur partial pressure within an order of magnitude, or a partial pressure which is greater than the sulfur partial pressure. This arrangement results in increased efficacy.

For example, a bulb of 28 mm ID was filled with 24 mg of sulfur and 400 torr of xenon at room temperature. An increase in efficacy of 6% was realized over the case where 60 torr of argon was used as the inert gas.

Figure 6:
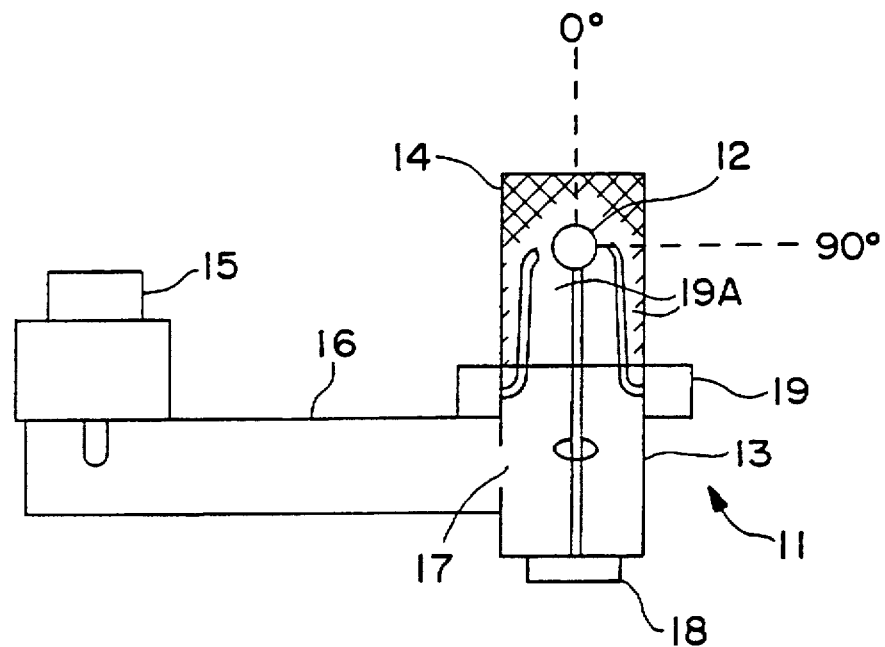
FIG. 6 shows a further embodiment of a high pressure sulfur or selenium containing lamp.

Referring to FIG. 6, a lamp embodiment which is used to illustrate a further aspect of the present invention is depicted. Lamp 11 is an electrodeless lamp which is powered by microwave energy. Bulb 12, which contains a high pressure fill, and is made of quartz or other suitable material, is supported in a microwave cavity, which is comprised of conductive housing 13 and mesh 14. Magnetron 15 generates microwave energy, which is fed by waveguide 16, to coupling slot 17 of the microwave cavity.

This excites the bulb fill to a plasma state, whereupon light is emitted by the fill, which is transmitted out of the cavity through mesh 14. The mesh is metallic, and is constructed so that it is substantially opaque to microwave energy, while being substantially transparent to the light which is emitted by bulb 12. The bulb is rotated by rotator 18, and the bulb envelope is cooled by gas which is fed in to plenum 19 and out through nozzles 19A.

Figure 7:
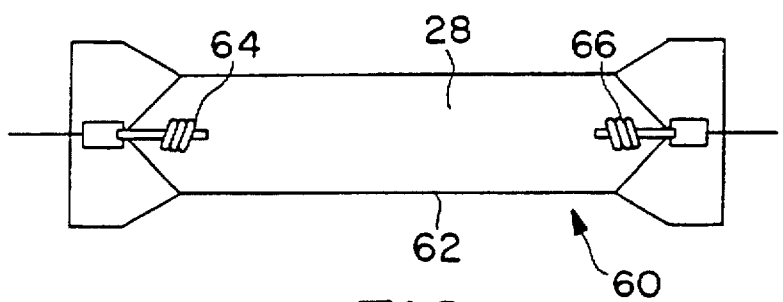
FIG. 7 shows a further embodiment of a sulfur or selenium containing lamp.

A further embodiment of a lamp is shown in FIG. 7. This is an arc lamp 60 which is comprised of quartz envelope 62 having electrodes 64 and 66, and containing fill 28. To excite the fill, an A.C. voltage is impressed across the electrodes, whereupon an arc discharge occurs therebetween.

As in the case of the electrodeless lamp, the fill contains a sulfur or selenium containing substance which is present at a high pressure of at least about 1 atmosphere and preferably in the range of about 2–20 atmospheres. An electrical voltage is applied across the electrodes such that a suitably high power density exists. Additionally, the electrodes 64 and 66 are made of or plated with a special material, to prevent chemical reactions with the fill gas which may lead to electrode deterioration. See U.S. application Nos. 604,487 and 071,027, now U.S. Pat. No. 5,404,076, which are incorporated by reference herein for details relating to operating parameters including power density and electrode material.

Figure 8:
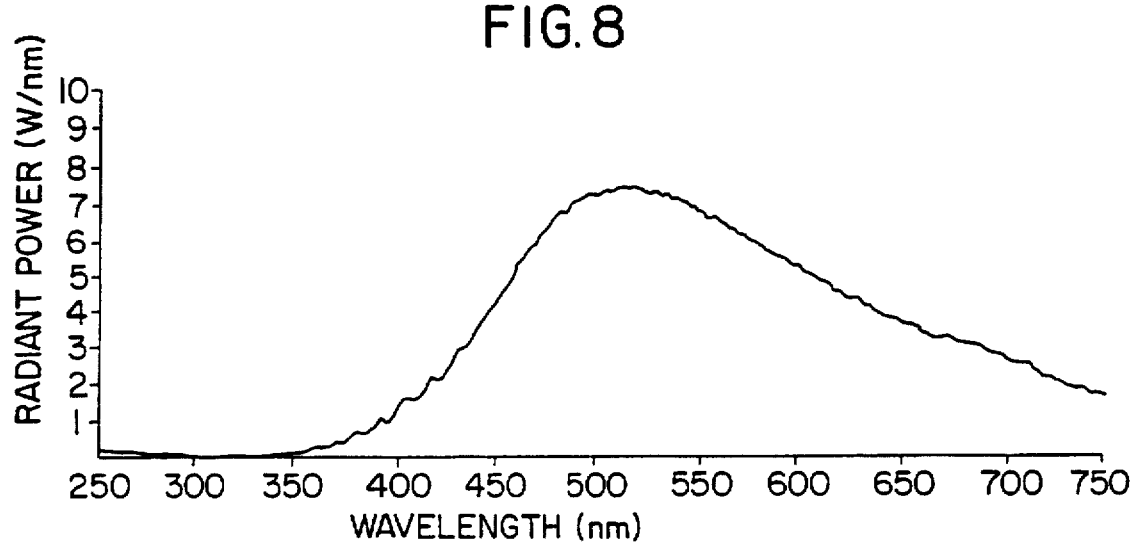
FIG. 8 shows a exemplary spectrum emitted by the lamp of FIG. 6.

The sulfur and selenium containing lamps described herein radiate a molecular spectrum in the visible region. A representative spectrum is depicted in FIG. 8 and is seen to be smooth, with the sharp peaks which are characteristic of atomic spectra being notably absent. The spectrum shown in FIG. 8 resulted when an electrodeless lamp such as is shown in FIG. 6 having a bulb of spherical shape of internal diameter 2.84 cm was filled with 0.062 mg-moles/cc of sulfur and 60 torr of argon, and was excited with microwave energy at a power density of about 280 watts/cc.

Figure 9:
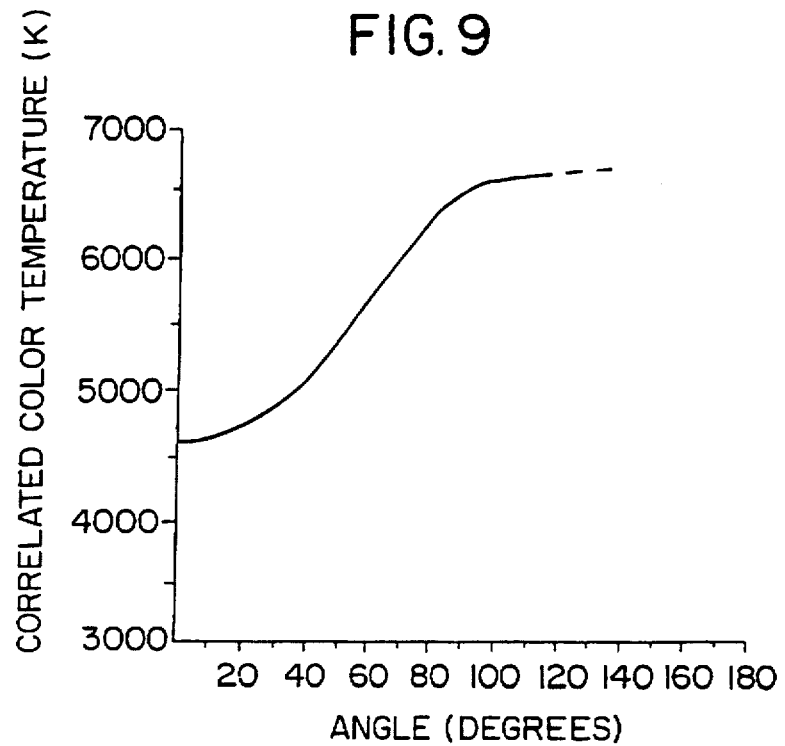
FIG. 9 is a graph of correlated color temperature vs. angular position for a lamp such as is shown in FIG. 6.

It has been observed that while light having the spectrum which is shown in FIG. 8 would be emitted from somewhere on the surface of the bulb, light having the identical spectrum would not in general be emitted from every point on the surface of the bulb. An accepted way of expressing spectral output is in terms of "color temperature" or "correlated color temperature", and thus stated differently, it was found that the color temperature or correlated temperature of the light varied as a function of the angle from which the bulb is observed. This is depicted in FIG. 9, which is a graph of correlated color temperature vs. observation angle. It is seen that as one progresses from the 0° line shown in FIG. 6, through the 900 line, and then on to a displacement of 180°, the color of the emitted light changes. As mentioned above, for many applications, a bulb with a spatially uniform color temperature would provide a better result. Additionally, the phenomenon of spatial "color separation" becomes more pronounced as the power level of the excitation energy decreases, either by virtue of dimming the lamp, or operating it at a lower power. It was also found that it may not be possible to dim the lamp as much as is desired, since the lamp may extinguish when a low power threshold is crossed.

It was further found that the above-described sulfur and/or selenium containing lamps do not always start in a fast and reliable fashion. In the case of the lamp shown in FIG. 6, it is standard to use a supplemental light source to provide additional energy to initiate starting. However, even with the use of such supplemental light source, starting may not always be reliable.

In accordance with an aspect of the present invention, a substance is added to the bulb fill which has a low ionization potential. Such a substance has electrons which are loosely bound, thereby making them easy to dislodge. It has been found that when such a substance is added to the bulb fill, one or more of the uniformity of the color temperature, bulb extinguishing characteristics, and bulb starting characteristics, are improved.

One class of low ionization potential materials are the alkalai metals, and it has been found that when an alkalai metal containing substance is added to the fill, the following advantages result:

a) the color temperature of the emitted light around the surface of the bulb becomes spatially more uniform, and this is in general true even at lower power densities;

b) the lamp starts more reliably; and c) the lamp may be operated at lower power levels without extinguishing.

The alkalai metals may be used in either elemental or compound form, and one such substance which may be used is sodium. Other alkalai metals are lithium, potassium, rubidium, and cesium. By way of non-limitative examples, compounds in the form of halides or sulfides may be used, for example NaI, $Na_2S$ or LiI. Adding a sodium containing substance to the bulb fill may also have the effect of providing spectral emphasis in the red part of the spectrum.

Another class of low ionization potential materials are the III B metals. It was found that when a III B metal containing substance was added to the fill, the color temperature of the emitted light become more uniform, and this is in general true even at lower power densities. Furthermore, it is possible to operate the lamp at lower power levels without extinguishing. The III B metals include indium, thallium, gallium, aluminum, and may be used in elemental or compound form, for example combined as halides such as InI, TlI, TlBr, or combined as sulfides such as InS, $Tl_2Se$, or $Tl_2S$.

A further grouping of low ionization materials are the alkaline earth or rare earth elements. Such substances cause the lamp to start more reliably. The alkaline earth metals are barium, beryllium, magnesium, calcium, strontium, and radium, and they may be used in elemental or compound forms, for example combined as halides such as $CaBr_2$, $BaI_2$, $SrI_2$ and sulfides, such as CaS, BaS, BaSe. The rare earth elements are yttrium, scandium, and lanthanum through lutetium. The improved starting is due to the low work functions of the alkaline earth and rare earth elements.

It was further found that the addition of mercury to the bulb improved starting reliability.

The amount of the above-mentioned additives to be used to produce optimum results for different applications may vary. For example, for the lamp desired above which produced the spectrum of FIG. 8, Na may be added in an amount of at least 0.001 mg/cc, In may be added in an amount of at least 0.01 mg/cc, and Ba may be added in an amount of at least 0.005 mg/cc. Additives may produce spectral emphasis, so that the resultant spectrum may not be identical to that shown in FIG. 8. In the case of mercury, at least 0.1 mg/cc should be used. It may also be possible to use a combination of the additives disclosed herein together in the lamp fill. It is further noted that since some of the above-mentioned additives improve lamp starting, it may be possible, in certain implementations, to eliminate the inert gas constituent of the fill.

The following Examples are illustrative:

EXAMPLE I

In a lamp as shown in FIG. 6, a bulb which is 2.84 cm in interior diameter was filled with 24 mg of S (2 mg/cc) and 60 torr of Ar., and operated at a suitably high power density. A figure of merit identified as "uniformity", is defined as the ratio of the minimum to maximum intensity of the light outputted by the bulb considering all angular positions except where the bulb is obstructed, e.g., by a narrow screen ring. The reason that the "uniformity" is a figure of merit representative of the color separation effect is that for lamps of this type, regions of lower color temperature also have lower output. The uniformity for the lamp was found to be 0.81.

EXAMPLE II

A lamp as described and operated in connection with Example I was filled with 24 mg of S (2 mg/cc), 60 torr of Ar., and 0.2 mg of NaI (0.017 mg/cc) which contained 0.031 mg (0.0026 mg/cc) of Na. The "uniformity" was 0.97, and a uniform color temperature around the angular extent of the bulb could be visually observed.

EXAMPLE III

A lamp as described and operated in connection with Example I was filled with 24 mg of S (2 mg/cc), 60 torr of Ar., and 0.3 mg of InI (0.025 mg/cc) containing 0.143 mg (0.012 mg/cc) of In. The "uniformity" was 0.91.

EXAMPLE IV

A lamp as described and operated in connection with Example I was filled with 24 mg of S (2 mg/cc), 60 torr of argon, and 1 mg (0.083 mg/cc) of BaS containing 0.81 mg (0.068 mg/cc) of Ba or instead of the BaS, 7 mg of Hg. An improvement in the starting reliability of the lamp was observed.

It should be noted that in term "power density", the volume (cc) refers to the volume of the light emitting gas rather than to the volume of the bulb. Further, it should be noted that the term "operating temperature" as used herein is the temperature which is attained by the bulb during operation.

It is significant that when fill additives as discussed herein are used it may be possible to operate the lamp at significantly lower power densities than indicated above without causing objectionable color separation or bulb extinguishment.

Figure 10:
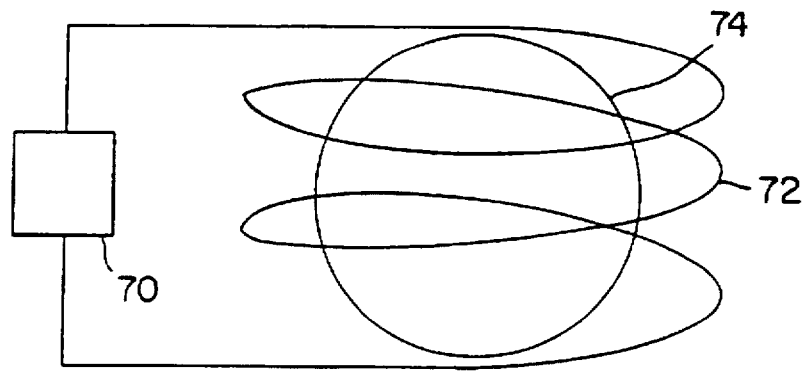
FIG. 10 shows a further embodiment of a lamp which may incorporate the invention.

A further embodiment of the invention is shown in FIG. 10, which is an illustrative example of a lamp which is excited with electromagnetic energy in the radio frequency range. In this regard, the term "electromagnetic energy" as used herein refers to both microwave and r.f. modes.

Referring to FIG. 10, r.f. source 70 generates r.f. power which is fed to induction coil 72. Bulb 74, which houses a sulfur or selenium containing fill as described above also includes additives which may include an alkalai halide containing substance or a III B metal containing substance as discussed above. In the operation of the lamp, r.f. energy from the induction coil 42 is coupled to the bulb fill, thereby exciting it to produce a spectrum in the visible range as previously described. The additives mentioned above permit operation at lower power densities, which in general is a significant advantage, and may be a particular advantage in the use of r.f. lamps. The invention may be applied to the different types of r.f. lamps, which include by way of non-limitative example, inductively and capacitively coupled lamps.

As is well known to those skilled in the art, the particular form of the electrodeless lamp heretofore described is exemplary only, and other specific shapes and types of cavities, for example, substantially all mesh type, as well as different types of coupling modes using one or more power sources, and one or more waveguides or other coupling modes may be used.

Figure 11:
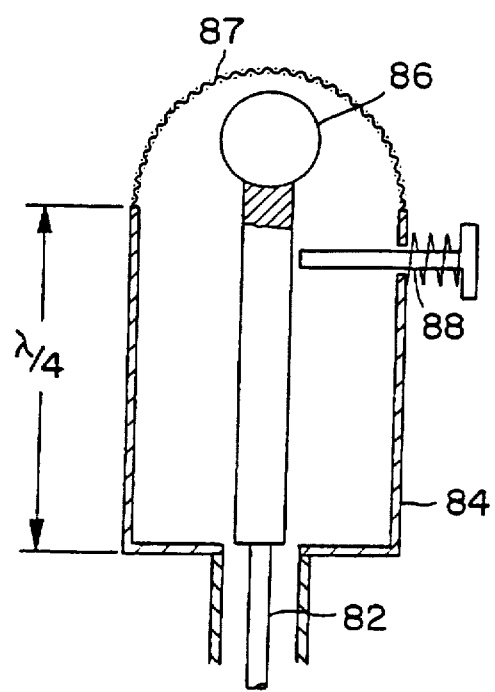
FIGS. 11 and 12 show further embodiments of sulfur or selenium based discharge lamps.

For example, FIG. 11 illustrates a lamp wherein coupling is effected in a coaxial mode. Microwave power is provided to inner and outer conductors 82 and 84 for coupling to bulb 86. A conductive mesh 87 is connected to the outer conductor. A tuning element 88 may be provided to help in starting the lamp.

Figure 12:
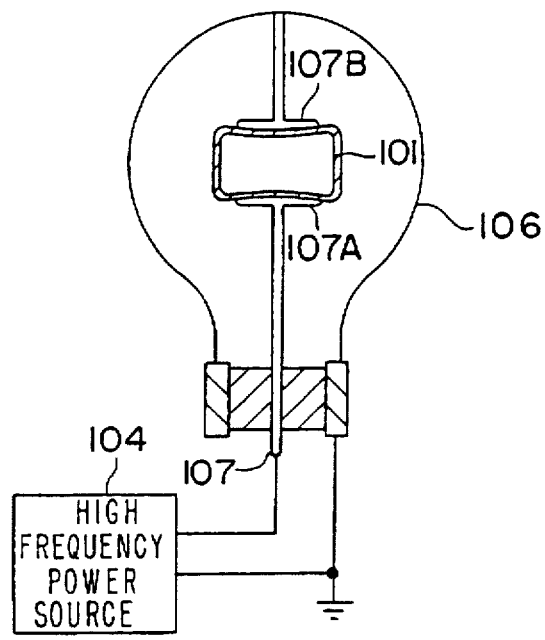

FIG. 12 depicts a further embodiment which is powered by r.f. or microwave power. Power from high frequency power source 104 is coupled to inner conductor 107 and outer conductor 106, which is a conductive mesh, the bulb 101 is supported between inner conductive member 107A and inner conductive member 107B. The embodiment shown in FIG. 12 may be considered to be a form of capacitive coupling.

As discussed above, the sulfur and selenium containing lamps described herein radiate a molecular spectrum in the visible region. A representative spectrum is smooth, with the sharp peaks which are characteristic of atomic spectra being notably absent.

Figure 13:
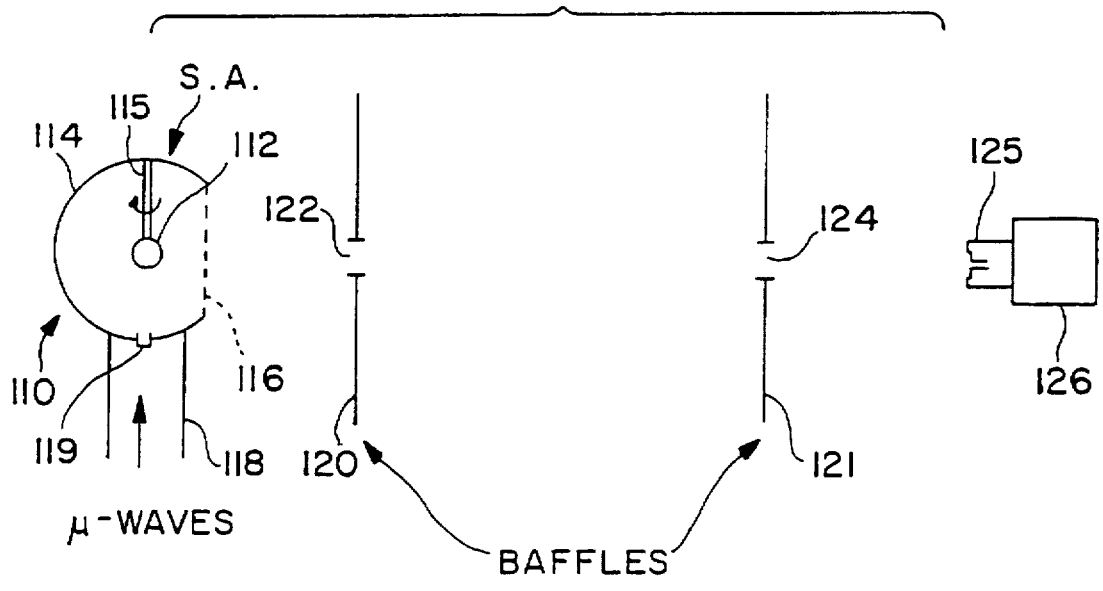
FIG. 13 shows a lamp with a spherical reflector in a spectrum measuring setup.

FIG. 13 depicts an embodiment of the invention wherein electrodeless lamp 110 is shown which has a fill wherein a sulfur containing substance or a selenium containing substance is the primary radiating component, as described above. Bulb 112 is secured in approximately spherical reflector 114 by bulb stem 115. The bulb stem may be arranged for rotation while streams of cooling fluid are directed at the bulb, to effect cooling (not shown). A mesh 116 contains microwave energy while allowing the emitted light to escape. Microwave energy is fed to the cavity via waveguide 118, and is coupled thereto through slot 119.

In accordance with an aspect of the invention, reflector 114 is approximately spherical in shape. This causes the light to be reflected by the reflector back into the bulb. The resultant light which is re-emitted from the bulb is stronger in higher wavelengths than in the case where light is not reflected back into the bulb.

This was demonstrated by the experimental setup depicted in FIG. 13, wherein the light emitted by the lamp is fed through baffles 120 and 121, which have co-linear openings 122 and 124 respectively disposed therein. A diffuser 125 backed by monochromator 126 is located in line with the baffle openings so as to receive the light coming therethrough.

Spectral measurements were taken for the case where the inside of reflector 114 is blackened, so as to be non-reflective, and the case where the reflector is shiny. The bulb was 2 cm in inner diameter and was filled with 2 mg/cc of elemental sulfur and 60 torr of argon, and was excited at a power density of about 325 watts/cc.

Figure 14:
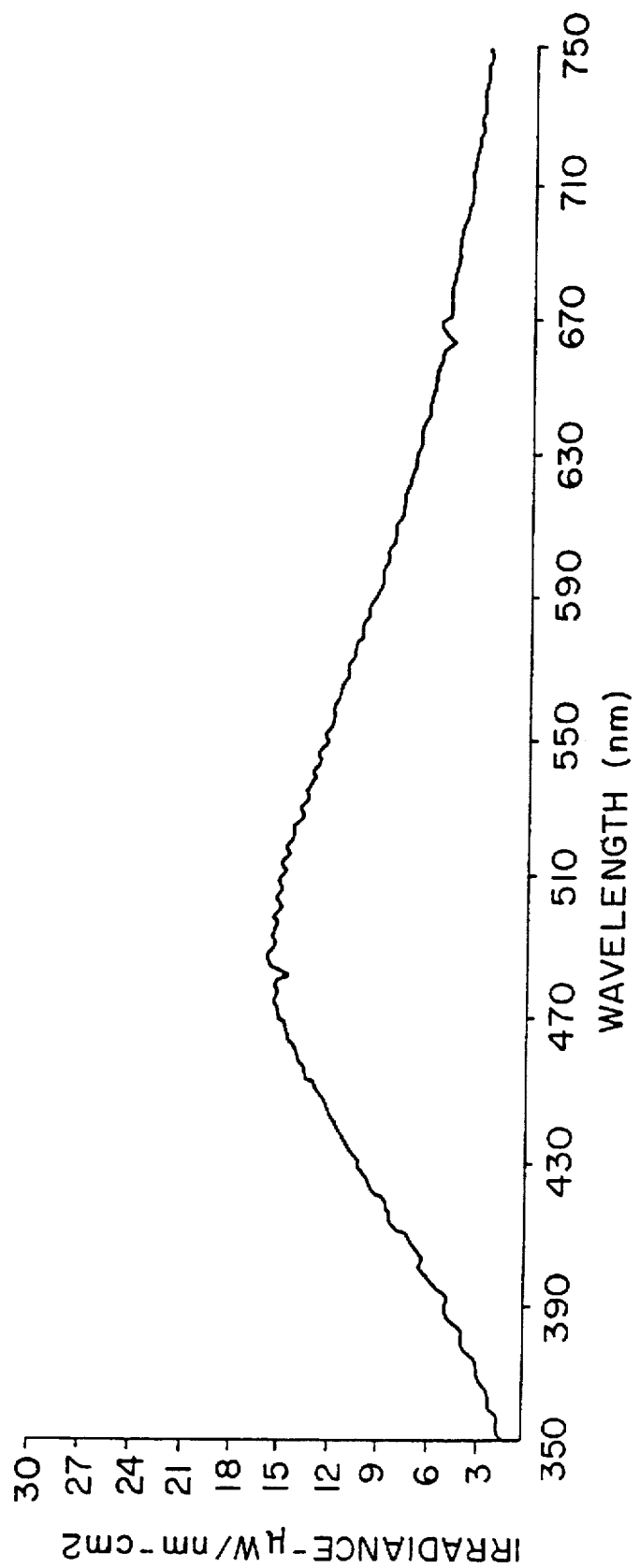
FIG. 14 shows the spectrum obtained with the arrangement of FIG. 13 when the reflector is blackened.
Figure 15:
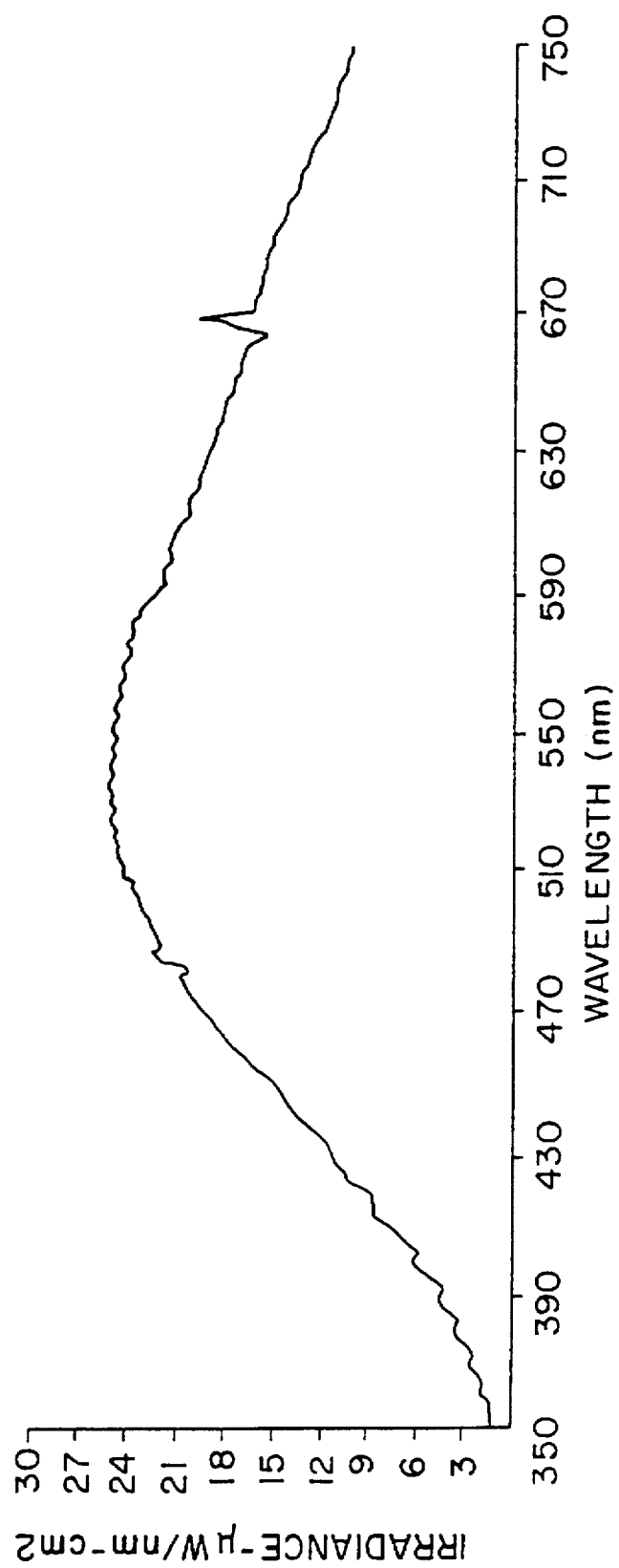
FIG. 15 shows the spectrum obtained with the arrangement of FIG. 13 when the reflector is shiny.
Figure 16:
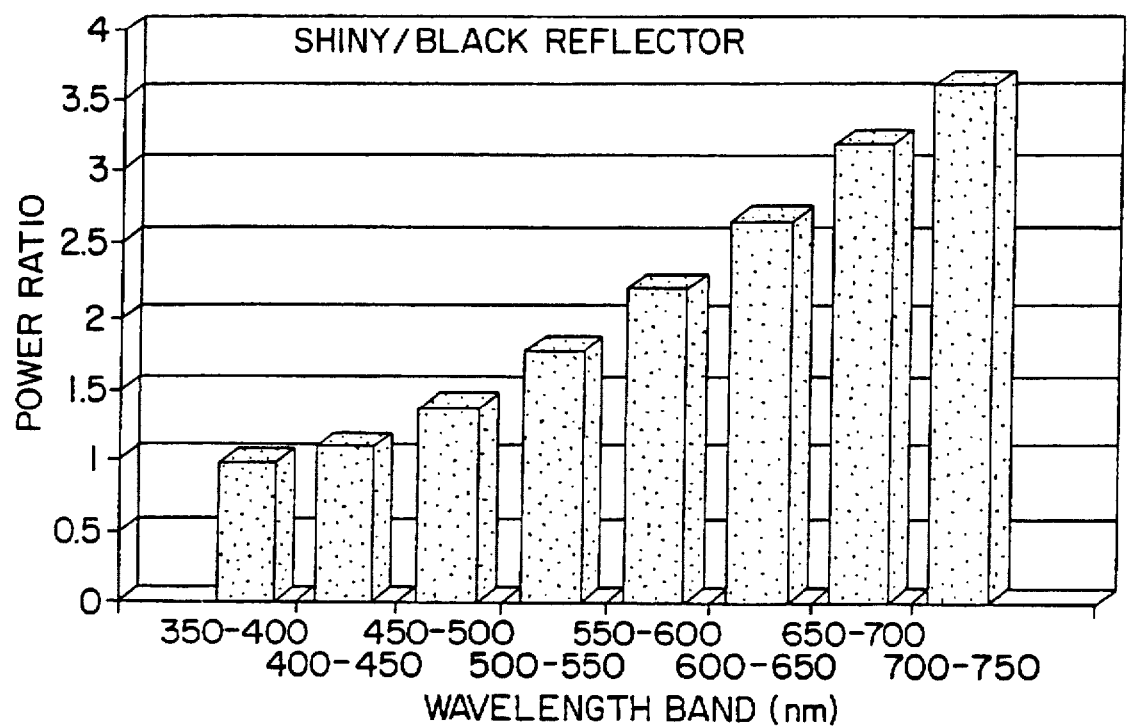
FIG. 16 is a graph depicting the power ratios of shiny/black reflectors by wavelength range.

The resultant spectrum for the case where the reflector is blackened is shown in FIG. 14, while the spectrum for the case where the reflector is shiny is shown in FIG. 15. The data is expressed in irradiance (power per wavelength interval per square centimeter). As can be seen, not only does the lamp with shiny reflector produce a more intense output, but there is a greater concentration of higher wavelengths. This is shown more exactly in FIG. 16, which is a bar graph of the output power ratio of the lamp for shiny/black reflector. It is seen that the power ratio is about a factor of 2 in the yellow region of the spectrum, and a factor of about 3 in the red region. Thus, a lamp which is rich in such wavelengths may be produced by following the teachings of the invention.

Additionally, it was found that the output from the lamp with the shiny reflector was more uniform than that of the lamp with the black reflector, and while the bulb in the shiny reflector ran hotter than the bulb in the black reflector, it did not run much hotter, so that additional light power was obtained with only a modest increase in cooling requirement.

In accordance with a further aspect of the invention, selective wavelengths may be reflected back into the bulb to cause the lamp to emit a spectrum which is more equivalent to the spectrum radiated by a black body. For example, this may be effected with the use of dichroic reflectors in either discrete form, or disposed directly on the bulb in the form of a coating.

For example, if a dichroic reflector in the form of an optically thin filter which reflects only in the green region is disposed on the bulb, the output in the green region of the spectrum may be substantially cut, for example by a factor of 2. At the same time, the output in the red region of the spectrum increases.

Figure 17:
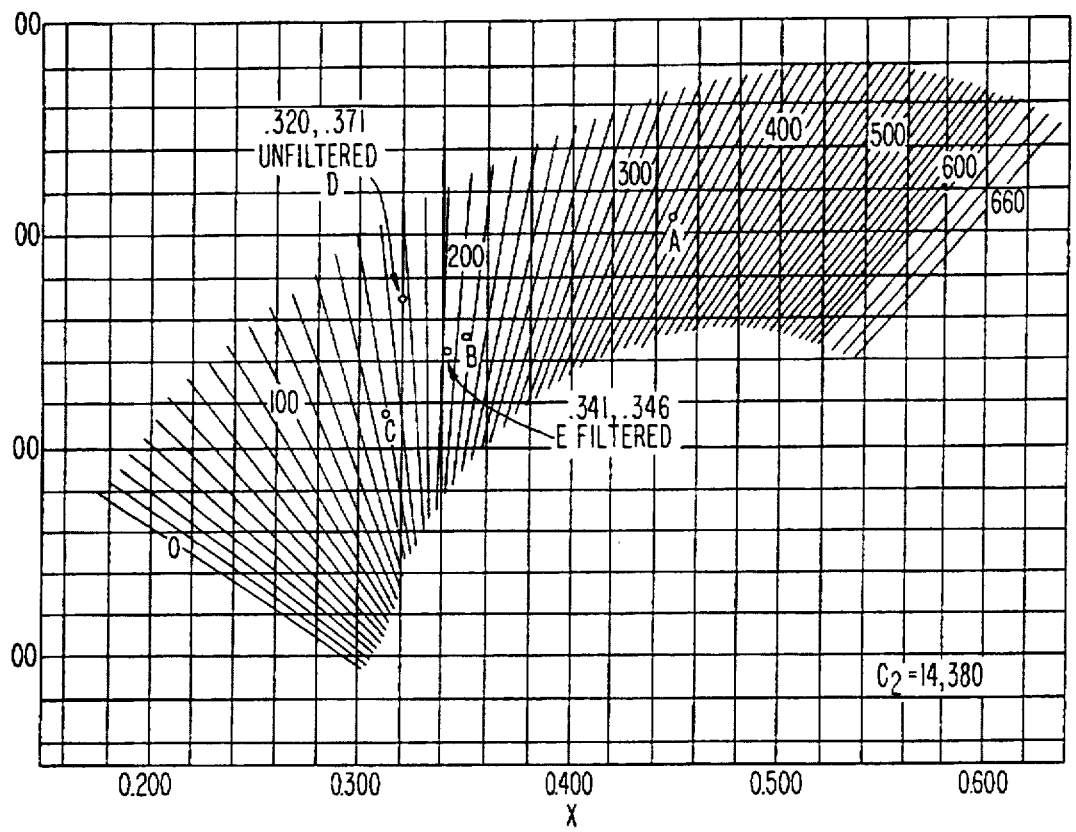
FIG. 17 is a 1931 chromaticity diagram depicting coordinates of an uncorrected and corrected lamps respectively.

Thus, a lamp having a spectrum produced by a sulfur fill modified as described above will emit more nearly like a black body. This is shown in FIG. 17, which is a 1931 chromaticity diagram. The position of the unfiltered output of such a lamp is shown at point D, where x=0.320 and y=0.371, while the position of the filtered output using a dichroic reflector which reflects only in the green region is shown at point E, which is at the black body line, where x=0.341 and y=0.346.

Figure 18:
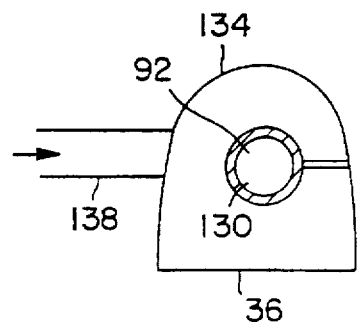
FIG. 18 shows a further embodiment of the invention.

FIG. 18 shows an embodiment of the invention using a dichroic reflector/filter such as described above. In this embodiment, the dichroic reflector 130 is disposed on spherical bulb 92 which is located in reflector 134 which is closed by mesh 136. As known to those skilled in the art, such a dichroic reflector may be comprised of alternating layers of materials having different indices of refraction. For example, for reflecting in the green or green-yellow part of the spectrum around 540 nm with about a 50 nm bandwidth, a dichroic reflector comprised of 5 sets of alternating layers of zirconium oxide and silicon dioxide using layers 67.5 and 89 nm thick, respectively, may be used. As is known, the thickness and number of layers may be varied to change the spectral band which is reflected.

In accordance with a further aspect of the invention, the spectral output of the lamp may be tailored for particular applications by reflecting back selected wavelengths into the bulb. For example, a lamp in which green radiation is reflected back may be used for horticultural applications such as for plant growth as in greenhouses. Thus, the spectrum of the sulfur-based lamp is inherently high in green wavelengths, and these are attenuated by the dichroic filter, while the red wavelengths, which are useful in inducing plant growth are increased. Wavelengths other than green may be reflected back to produce different resultant spectral outputs.

It should be understood that while the invention has been illustrated in connection with specific embodiments, variations will occur to those skilled in the art, and the scope of the invention is to be limited only by the claims which are appended hereto and equivalents.

We claim:

1. A visible discharge lamp which provides a spectral power distribution having a peak at one of many possible peak wavelengths comprising, an envelope which contains a fill having at least one visible light emitting component, wherein the visible light emitting component which emits more visible light than any other such component which may be present is a substance selected from the group consisting of sulfur and selenium, wherein said sulfur or selenium emits principally visible light, excitation power generating means, and means for coupling power generated by said excitation power generating means to said envelope fill, said lamp during excitation producing an output spectral power distribution in a continuous band having a peak at a certain wavelength which corresponds to a first particular density of said sulfur or selenium, wherein other possible peak wavelengths correspond to other particular fill densities, and said lamp fill is provided with said sulfur or selenium at said first particular density during excitation so as to result in said spectral distribution which has a peak at said certain wavelengths.

2. The lamp of claim 1 wherein said lamp is electrodeless.

3. The lamp of claim 2 wherein said substance is sulfur.

4. The lamp of claim 2 wherein said substance is selenium.

5. The lamp of claim 2 wherein the visible light emitted by the sulfur or selenium is molecular radiation.

6. A visible discharge lamp for producing a desired spectral output comprising, an envelope which contains a fill which includes at least one substance during excitation which is selected from the group consisting of sulfur and selenium, wherein said substance emits principally visible light in a continuous band, excitation power generating means, and means for coupling power generated by said excitation power generating means to said envelope fill, said substance during excitation producing an output spectral power distribution having a peak at a certain wavelength which corresponds to a particular density of said substance, wherein other possible peak wavelengths correspond to other particular densities of said substance, and said lamp fill is provided with said substance at said particular density so as to result in said desired spectral output.

7. The lamp of claim 5 wherein the visible light emitted by said substance is molecular radiation.

* * * * *

UNITED STATES PATENT AND TRADEMARK OFFICE
CERTIFICATE OF CORRECTION

PATENT NO. : 5,798,611
DATED : August 25, 1998
INVENTOR(S) : Dolan, James T. et al.

Page 1 of 1

It is certified that error appears in the above-identified patent and that said Letters Patent is hereby corrected as shown below:

<u>Title page,</u>
Brian Turner is not an inventor of the claimed invention.

<u>Column 3,</u>
Line 59, delete "energy" and insert -- power --.
Line 63, delete "wavelength peak" and insert -- CCT --.

<u>Column 5,</u>
Line 15, delete "energy" and insert -- power --.
Line 16, after "shown." insert -- The subject lamp is able to provide radiation principally within the visible range. --
Lines 63-64, delete "peak wavelength" and insert -- CCT --.

<u>Column 14, claim 7,</u>
Line 31, change "5" to -- 6 --.

Signed and Sealed this

Second Day of April, 2002

Attest:

*Attesting Officer*

JAMES E. ROGAN
*Director of the United States Patent and Trademark Office*